United States Patent [19]

Segawa et al.

[11] Patent Number: 5,548,229

[45] Date of Patent: Aug. 20, 1996

[54] TRI-STATE OUTPUT BUFFER CIRCUIT

[75] Inventors: Reiji Segawa; Tatsuhiko Nagahisa, both of Osaka, Japan

[73] Assignee: Matsushita Electric Industrial Co., Ltd., Osaka, Japan

[21] Appl. No.: 364,105

[22] Filed: Dec. 27, 1994

[30] Foreign Application Priority Data

Dec. 28, 1993 [JP] Japan .................................. 5-337860

[51] Int. Cl.$^6$ .............................................. H03K 19/0948
[52] U.S. Cl. ................................. 326/57; 326/58; 326/83; 327/407
[58] Field of Search ................................. 326/27, 21, 56, 326/57, 58, 83, 86, 121; 327/407, 408, 409, 410

[56] References Cited

U.S. PATENT DOCUMENTS

| | | | |
|---|---|---|---|
| 4,037,114 | 7/1977 | Stewart et al. | 326/83 |
| 4,804,867 | 2/1989 | Okitaka et al. | 326/58 |
| 5,120,992 | 6/1992 | Miller et al. | 326/56 |
| 5,179,299 | 1/1993 | Tipon | 326/58 |
| 5,369,316 | 11/1994 | Chen et al. | 326/83 |

Primary Examiner—Edward P. Westin
Assistant Examiner—Benjamin D. Driscoll
Attorney, Agent, or Firm—McDermott, Will & Emery

[57] ABSTRACT

A single data output terminal and an output portion having a pair of output control terminals for generating a ternary output, are disposed for a plurality of data input terminals and a plurality of control input terminals in the same number as that of the data input terminals. Input changeover portions have (i) a state where data signals can be entered into the output control terminals and (ii) a state where the data signals cannot be entered into the output control terminals. An input control portion supplies, according to the states of control signals entered therein, a changeover signal for switching the input changeover portions to (i) a mode in which one of the input changeover portions is set to the conductive state, or (ii) a mode in which all of the input changeover portions are set to the non-conductive state. According to the states of entered control signals, an output control portion controls the output portion such that a high impedance signal is supplied according to a changeover signal for setting all of the input changeover portions to the non-conductive state, and that there is generated an output signal identical with the value of an entered binary data signal according to a changeover signal for setting one of the input changeover portions to the conductive state.

9 Claims, 11 Drawing Sheets

TRI-STATE OUTPUT BUFFER CIRCUIT

(BACKGROUND OF THE INVENTION)

The present invention relates to an output buffer circuit disposed in a semiconductor integrated circuit, and more particularly to a ternary output-type buffer arranged to supply an output, in the form of a ternary value, as selected from a plurality of data inputs.

A ternary output-type buffer is conventionally disposed in a peripheral circuit, for example an I/O circuit, of a memory cell array such as a SRAM or the like as shown in FIG. 8 for example. The ternary output-type buffer is arranged to supply an output in any of the states "H", "L" and "Hz" (high impedance). More specifically, the ternary output-type buffer can provide, in addition to the states "H" and "L", the state "Hz" (high impedance state) in which the output is supplied as separated from the input. Thus, a plurality of signals entered from a plurality of input terminals can successively be supplied through the common output terminal and signal line.

FIG. 9 shows the arrangement of a conventional ternary output-type buffer 600 comprising: a data input terminal 601 for receiving a data input signal Din: a control input terminal 602 for receiving a control signal En; a NOT circuit 610 for generating an inversion signal of the control signal En; a NAND circuit 620 for generating a NAND signal of the data input signal Din and the control signal En; and a NOR circuit 630 for generating a NOR signal of the data input signal Din and the signal obtained by inverting the control signal En by the NOT circuit 610; and an output circuit 640 of which output is controlled in the form of a ternary value by the NAND circuit 620 and the NOR circuit 630. The output circuit 640 comprises: a P-MOS transistor 641 having the gate for receiving, as a control signal, an output of the NAND circuit 620; an N-MOS transistor 642 which is connected, in series, to the P-MOS transistor 641 between a high-potential power source VDD and a low-potential power source GND (grounding terminal) and which has the gate for receiving, as a control signal, an output of the NOR circuit 630; and a data output terminal 603 which is led from the signal line between the transistors 641 and 642 and which is arranged to supply a data output signal Dout.

In the NAND circuit 620, there are disposed, between the high-potential power source VDD and the P-MOS transistor 641 of the output circuit 640, (i) a P-MOS transistor 621 serving as a switching element of which opening/closing is controlled by the control signal En and (ii) a P-MOS transistor 622 serving as a switching element of which opening/closing is controlled by the data input signal Din, the transistors 621 and 622 being disposed in parallel with each other. Also, there are disposed, between the gate of the P-MOS transistor 641 and the low-potential power source GND, (i) an N-MOS transistor 623 of which opening/closing is controlled by the data input signal Din and (ii) an N-MOS transistor 624 of which opening/closing is controlled by the control signal En, the transistors 623, 624 being disposed in series. In the NOR circuit 630, there are disposed, between the high-potential power source VDD and the gate of the N-MOS transistor 642, (i) a P-MOS transistor 632 of which opening/closing is controlled by the data input signal Din and (ii) a P-MOS transistor 633 of which opening/closing is controlled by the signal obtained by inverting the control signal En by the NOT circuit 610, the transistors 632, 633 being disposed in series. Also, there are disposed, between the control terminal of the output generation N-MOS transistor 642 and the low-potential power source GND, (i) an N-MOS transistor 634 of which opening/closing is controlled by the data input signal Din and (ii) an N-MOS transistor 635 of which opening/closing is controlled by the control signal En, the transistors 634, 635 being disposed in parallel.

In the ternary output-type buffer having the arrangement above-mentioned, as readily understood by executing the operations of NAND, NOT, NOR, when both the data input signal Din and the control signal En are in the state "H", the data output signal Dout is brought into the state "H". That is, there is formed an arrangement capable of supplying a ternary output by combining the NAND circuit with the NOR circuit. More specifically, the data output signal Dout is brought into the state "H" when both the data input signal Din and the control signal En are in the state "H", and the data output signal Dout is brought into the state "L" when the data input signal Din is in the state "L" and the control signal En is in the state "H", and the data output signal Dout is brought into the state "Hz" (high impedance) regardless of the state of the data input signal Din when the control signal En is in the state "L".

FIGS. 10 and 11 show conventional examples of the ternary output-type buffer capable of receiving a plurality of data signals.

FIG. 10 shows an example of prior art having a selector 500 disposed immediately before the ternary output-type buffer 600. Shown in FIG. 10 are: a first data input terminal 101A for receiving a first input signal DinA; a first control input terminal 102A for receiving a first control signal EnA which controls the output of the first input signal DinA; a second data input terminal 101B for receiving a second input signal DinB; and a second control input terminal 102B for receiving a second control signal EnB which controls the output of the second input signal DinB. The first input signal DinA and the second input signal DinB are entered through data input terminals 501, 503 in the selector 500. Either one of the input data signals is selected in the selector 500 and supplied from an output terminal 505 in the selector 500. The first control signal EnA and the second control signal EnB are entered through control input terminals 502, 503 in the selector 500. These control signals EnA, EnB control MOS transistors 508, 509 in the selector 500, and are entered into an OR circuit 507 which then generates a control signal for controlling the ternary output-type buffer 600. This control signal is supplied from a control output terminal 506. Control is made such that the first control signal EnA and the second control signal EnB are not simultaneously turned on.

In the ternary output-type buffer 600, the data signal and control signal selected or generated by the selector 500 are entered through the data input terminal 601 and the control input terminal 602. An output data signal is brought into any of three states "H", "L" and "Hz" by the NOT circuit 610, the NAND circuit 620, the NOR circuit 630 and the output circuit 640, and then supplied from an output terminal 105 through the data output terminal 603. To simplify the display of the circuit arrangement, this example uses the N-MOS transistors 508, 509 as means for selecting a data input signal Din in the selector 500. It is however required to use a ternary output-type buffer instead of N-MOS transistors in order to assure the circuit operation even with a low power voltage.

On the other hand, FIG. 11 shows an example of prior art in which a plurality of ternary output-type buffers 600A, 600B are disposed in parallel corresponding to a plurality of input data signals and control signals, and of which basic arrangement is different from that shown in FIG. 10. This ternary output-type buffer circuit is arranged such that, while controlled in state through NOT circuits 610, NAND circuits 620, NOR circuits 630 and output circuits 640 in the ternary output-type buffers 600A, 600B, the data signals are supplied to the common output terminal 105 through data output terminals 603 of the ternary output-type buffers 600A and 600B.

More specifically, to supply a signal in the form of a ternary value as selected from a plurality of data inputs, there have been employed either a method as shown in FIG. 10 in which there is added, upstream of the ternary output-type buffer, a selector for selecting one of a plurality of data inputs, or a method as shown in FIG. 11 in which ternary output-type buffers are respectively disposed for a plurality of data inputs and outputs from the buffers are supplied to the common output terminal.

However, the conventional ternary output-type buffers having the arrangements above-mentioned present the following problems.

In the arrangement in FIG. 10, as the number of inputs is increased, it is required to provide a voltage for operating the selector means such as the transistors 508, 509. This requires the use of ternary output-type buffers instead of the transistors 508, 509 in the selector 500. This increases the number of logic stages to disadvantageously lowering the signal processing speed in the selector 500. In the arrangement in FIG. 11, the drain capacitance generated in the MOS transistors at the commonly connected output stage, depends on the number of commonly connected ternary output-type buffers. This not only narrows the degree of freedom in design, but also lowers the signal processing speed due to an increase in drain capacitance.

(SUMMARY OF THE INVENTION)

It is a first object of the present invention to provide a first basic arrangement of a ternary output-type buffer capable of being applied to a circuit for receiving any of a variety of types of data inputs, yet assuring both a high-speed operation and low power consumption.

It is a second object of the present invention to provide a ternary output-type buffer capable of assuring both low power consumption and a high-speed signal processing, with the use of the first basic arrangement, even in an output buffer circuit for receiving a plurality of data inputs.

To achieve the first object, the present invention provides an output buffer circuit having the first basic arrangement comprising the following elements.

The output buffer circuit having the first basic arrangement comprises:

a data input terminal for receiving a data signal having a first value and a second value;

a control input terminal for receiving a control signal;

an output portion connected to the data input terminal through a signal line and having a pair of output control terminals connected to the data input terminal, the output portion being arranged for generating, according to the signal states of the output control terminals, a data output signal comprising three values of first, second and high-impedance values;

a data output terminal for externally supplying the data output signal generated by the output portion;

an input changeover portion disposed at the signal lines between the data input terminal and the output control terminals, and having (i) a conductive state where the data signal can be entered into the output control terminals and (ii) a non-conductive state where the data signal cannot be entered into the output control terminals;

an input control portion for receiving a control signal supplied from the control input terminal for generating a changeover signal for switching the input changeover portion to any of the conductive state and the non-conductive state; and an output control portion for receiving the changeover signal generated by the input control portion to control the output portion such that, according to a changeover signal for setting the input changeover portion to the conductive state, an output from the data output terminal is made identical with the value of the data signal entered into the output control terminals and that, according to a changeover signal for setting the input changeover portion to the non-conductive state, the output supplied from the data output terminal is brought into a high-impedance value.

According to the arrangement above-mentioned, an output in the form of a ternary value can securely be supplied from the data output terminal in the output circuit according to the changeover signal generated by the input control portion. When arranging the layout of a logic circuit in its entirety, there can be disposed, as a cell, an output buffer circuit having such a first basic arrangement, thus simplifying the circuit design.

In the first basic arrangement, the input changeover portion may comprise two pairs of switching elements; one pair being connected in series between a power source for supplying high potential corresponding to the first value of the data signal and one of the output control terminals, and the other pair being connected in series between a power source for supplying low potential corresponding to the second value of the data signal and the other of the output control terminals, the switching elements being arranged to be opened and closed according to the data signal and the control signal.

According to the arrangement above-mentioned, the switching elements provide (i) the state where a data signal can be entered into the output control terminals and (ii) the state where the data signal cannot be entered into the output control terminals. Accordingly, even in the event that a large number of data signals are entered, an increase in the number of logic stages can be minimized. Thus, the ternary output buffer function can smoothly be performed without data signals interfering with one another, yet assuring low power consumption and a high-speed operation.

In the first basic arrangement, the output portion may comprise: a first output generation switching element disposed between the power source for supplying a high-potential electric power corresponding to the first value of the data signal and the data output terminal, the switching element being so arranged as to be opened and closed according to the signal state of one of the pair of output control terminals; and a second output generation switching element disposed between a power source for supplying a low-potential electric power corresponding to the second value of the data signal and the data output terminal, the switching element being so arranged as to be opened and closed according to the signal state of the other of the output control terminals.

Further, the output control portion may comprise;

connection/disconnection changeover means for electrically connecting and disconnecting the pair of output control terminals to and from each other; and high impedance signal introducing means for turning the output generation switching elements to off and for introducing a signal for electrically disconnecting the pair of output control terminals from each other by the connection/disconnection changeover means.

Further, the output control portion may be so arranged as to control the connection/disconnection changeover means and the high impedance signal introducing means such that, according to the changeover signal for setting the input changeover portion to the conductive state, the output control terminals are electrically connected to each other and a high impedance signal is prevented from being introduced, and that, according to the changeover signal for setting the input changeover portion to the non-conductive state, the output control terminals are electrically disconnected from each other and a high impedance signal is allowed to be introduced.

According to the arrangement above-mentioned, when the input changeover portion is set to the conductive state, the signal states of the output control terminals in the output circuit undergo a change according to the input data. When the first output generation switching element is closed according to the signal state of one of the output control terminals, a high-potential electric power is supplied to the data output terminal, which then supplies a first value. When the second output generation switching element is closed, a low-potential electric power is supplied to the data output terminal, which then supplies a second value. On the other hand, when the input changeover portion is set to the non-conductive state, the output control portion causes the connection/disconnection changeover switching elements to be non-conductive such that the output control terminals are electrically disconnected from each other. Also, the high impedance signal introducing means causes the output control terminals to be electrically disconnected from each other. The data output terminal, is brought into the high impedance state and a signal for high impedance is supplied therethrough.

To achieve the second object, the present invention provides an output buffer circuit having a second basic arrangement including the following elements.

The output buffer circuit having the second basic arrangement comprises:

a plurality of data input terminals for receiving data signals;

a plurality of control input terminals for receiving control signals, the number of the control input terminals being the same as that of the data input terminals;

an output portion connected to the data input terminals through signal lines and having a pair of output control terminals connected to the data input terminals, the output portion being arranged for generating, according to the signal states of the output control terminals, a data output signal comprising three values of first, second and high-impedance values;

a data output terminal for externally supplying the data output signal generated by the output portion;

a plurality of input changeover portions each disposed at the signal lines between each of the data input terminals and the pair of output control terminals, and having (i) a conductive state where each of the data signals can be entered into the output control terminals and (ii) a non-conductive state where each of the data signals cannot be entered into the output control terminals, the number of the input changeover portions being the same as that of the data input terminals;

an input control portion connected to the control input terminals for generating, according to the states of the control signals, a changeover signal for switching the input changeover portions to (i) a mode in which only one of the input changeover portions is set to the conductive state or (ii) a mode in which all of the input changeover portions are set to the non-conductive state: and an output control portion for receiving the changeover signal generated by the input control portion to control the output portion such that, according to a changeover signal for setting only one of the input changeover portions to the conductive state, an output supplied from the data output terminal is made identical with the value of the data signal entered into the output control terminals and that, according to a changeover signal for setting all of the input changeover portions to the non-conductive state, the output supplied from the data output terminal is brought into a high-impedance value.

According to the second basic arrangement above-mentioned, when a plurality of data signals are entered, the input control portion controls, according to the combination of control signals corresponding to these data signals, such that any of the data signals is entered into the output control terminals. The output control portion controls such that a signal identical with the data signal entered into the output control terminals from the output circuit, is supplied from the data output terminal. Accordingly, the desired data signal can be supplied from the data output terminal without data signals interfering with one another. When a data signal cannot be entered into the output control terminals, the output control portion controls such that an output of the output circuit is brought into a high impedance value. Thus, there is provided an output in the form of a ternary value. According to the arrangement above-mentioned, the processing speed is not lowered due to an increase in the number of logic stages as done in the arrangement having a selector for selecting one out of a large number of data input signals. Further, it is enough that the output stage has a pair of output control terminals and one data output terminal. This does not increase the drain capacitance in a plurality of commonly connected output stages as done in the arrangement having a plurality of output buffer circuits corresponding to the respective data input terminals. This assures the degree of freedom in design without processing speed lowered.

In the second basic arrangement, each of the input changeover portions may comprise two pairs of switching elements; one pair being connected in series between one of the output control terminals and a high-potential side power source, and the other pair being connected in series between the other of the output control terminals and a low-potential side power source, the switching elements being arranged to be opened and closed according to the data signals and the control signals.

In the second basic arrangement, the output portion may comprise:

a first output generation switching element disposed between the power source for supplying a high-potential electric power corresponding to a first value of each of the data signals and the data output terminal, the switching element being so arranged as to be opened and closed according to the signal state of one of the pair of output control terminals; and a second output generation switching element disposed between the power source for supplying a low-potential electric power corresponding to a second value of each of the data signals and the data output terminal, the switching element being so arranged as to be opened/closed according to the signal state of the other of the output control terminals, the output control portion may comprises:

connection/disconnection changeover means for electrically connecting and disconnecting the pair of output control terminals to and from each other; and high impedance signal introducing means for turning the output generation switching elements to off and for introducing a signal for electrically disconnecting the pair of output control terminals by the connection/disconnection changeover means, and the output control portion may control the connection/disconnect ion changeover means and the high impedance signal introducing means such that, according to the changeover signal for setting one of the input changeover portions to the conductive state, the output control terminals are electrically connected to each other and a high impedance signal is prevented from being introduced, and that, according to the changeover signal for setting all of the input changeover portions to the non-conductive state, the output control terminals are electrically disconnected from each other and a high impedance signal is allowed to be introduced.

In these arrangements, elements substantially the same as the elements added to the first basic arrangement, are added to the second basic arrangement, thus producing effects similar to those above-mentioned.

In addition, the connection/disconnection changeover means and the high-impedance signal introducing means may be disposed in each of the input changeover portions. Alternatively, the connection/disconnection changeover means and the high-impedance signal introducing means may be shared among the input changeover portions.

According to the arrangement above-mentioned, the connection/disconnection changeover switching elements and the output control portions are disposed in the number identical with the number of the data input terminals. This simplifies the electric wiring. In particular, when the connection/disconnection changeover switching elements and the output control portions are shared, the numbers of the connection/disconnection changeover switching elements and the output control portions are small to reduce the component elements in number, even though there are a plurality of data input terminals.

According to the second basic arrangement, the output buffer circuit may be disposed at the output side of a SRAM memory cell.

The output side of a SRAM memory cell is required to have the function of externally supplying a signal without a large number of data input signals interfering with one another. In such a case, too, there can be obtained a ternary output without the number of logic stages or drain capacitance increased.

(DETAILED DESCRIPTION OF PREFERRED EMBODIMENTS)

The following description will discuss embodiments of the present invention with reference to attached drawings.
(First Embodiment)

Figure 1:
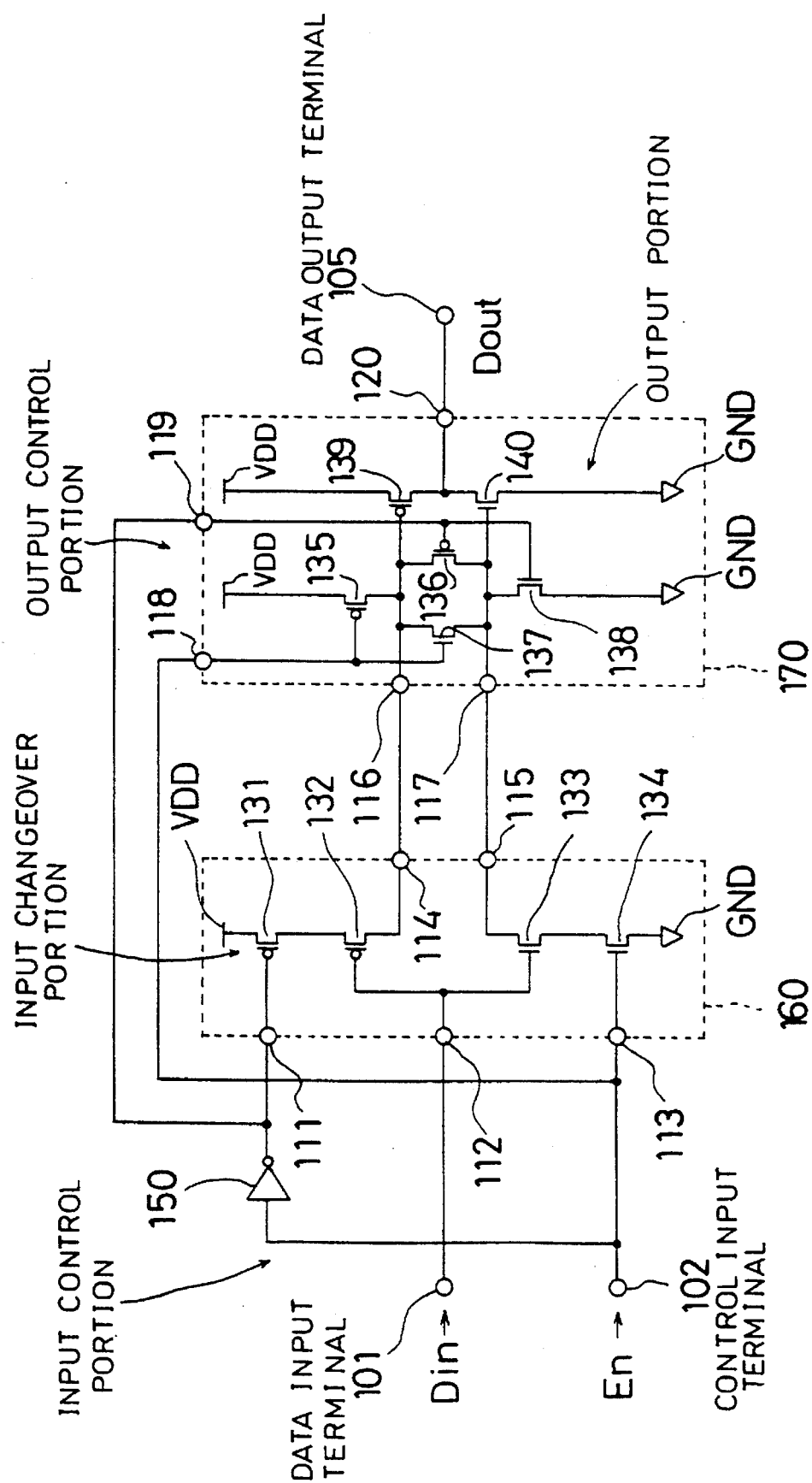
FIG. 1 is an electric circuit diagram illustrating the arrangement of an output buffer circuit according to a first embodiment of the present invention.
Figure 2:
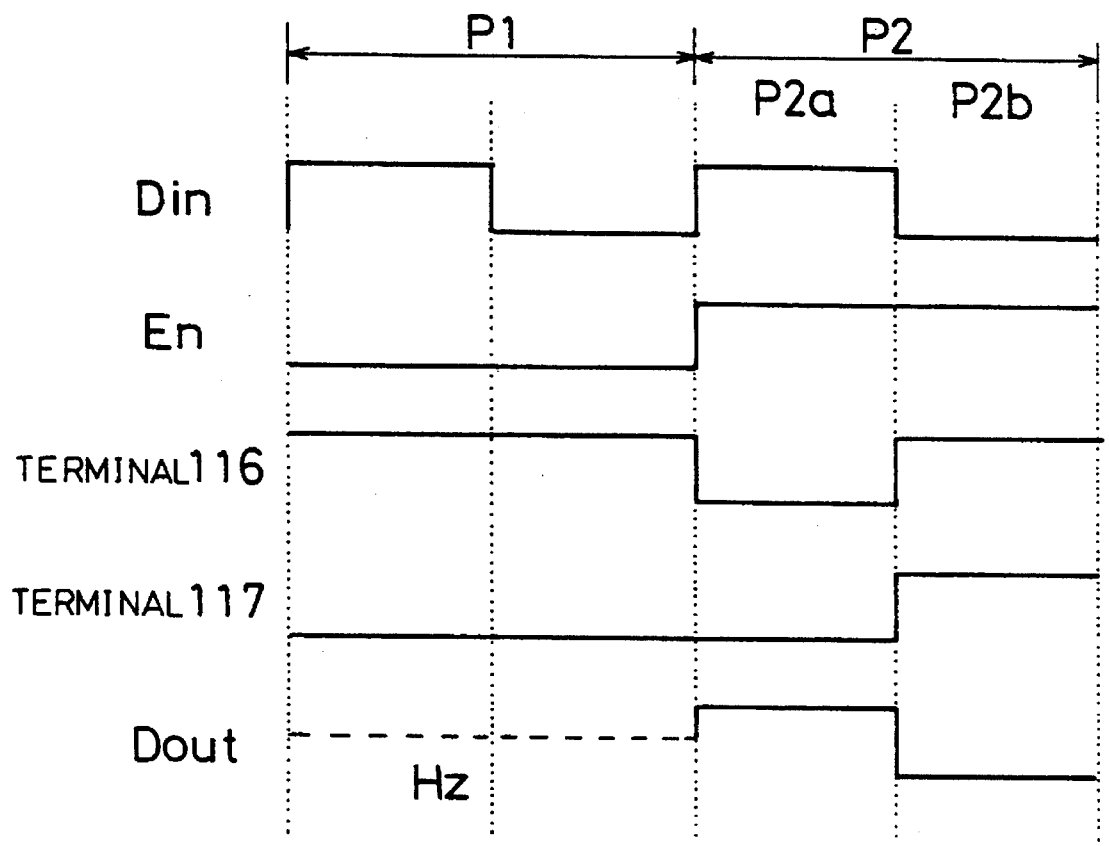
FIG. 2 is a timing chart illustrating the operational characteristics of the output buffer circuit according to the first embodiment.

With reference to FIGS. 1 and 2, the following description will discuss a first embodiment of the present invention. FIG. 1 shows a circuit diagram of a single ternary output-type buffer 100 according to the first embodiment.

Shown in FIG. 1 are a data input terminal 101 for receiving a data input signal Din, a control input terminal 102 for receiving a control signal En, a data output terminal 105 for supplying a data output signal Dout, first to tenth terminals 111 to 120, and first to tenth MOS transistors 131 to 140. The first, second fifth, sixth and ninth MOS transistors 131, 132, 135, 136, 139 are P-MOS transistors corresponding to normally closed switching elements which are arranged to be turned on when the potentials of the gates are in the state "L". The third, fourth, seventh, eighth and tenth MOS transistors 133, 134, 137, 138, 140 are N-MOS transistors corresponding to normally opened switching elements which are arranged to be turned on when the potentials of the gates are in the state "H". An inverter circuit 150 serves as a NOT circuit for inverting the control signal En entered through the control input terminal 102. There are also disposed an input circuit 160 and an output circuit 170. The sixth terminal 116 and the seventh terminal 117 serve as a pair of output control terminals.

In the input circuit 160, the first and second MOS transistors 131, 132 (P-MOS transistors) are connected in series between a high-potential power source VDD and the fourth terminal 114. The gate of the first MOS transistor 131 is connected to the control input terminal 102 through the first terminal 111 and the inverter circuit 150, and the gate of the fourth MOS transistor 134 is connected to the control input terminal 102 through the third terminal 113. Also, the gates of the second and third MOS transistors 132, 133 are connected to the data input terminal 101 through the second terminal 112. The third and fourth MOS transistors 133, 134 are connected in series between the fifth terminal 115 and a grounding terminal or low-potential power source GND.

The data input signal Din entered from the data input terminal 101 through the second terminal 112, switches the opening/closing state of the gate of the third MOS transistor 133. The control signal En entered through the third terminal 113 switches the opening/closing state of the gate of the fourth MOS transistor 134.

An input changeover port;ion is formed by (i) the first and second MOS transistors 131, 132 disposed in series between the power source VDD and the fourth terminal 114 (i.e., the sixth terminal 116) and (ii) the third and fourth MOS transistors 133, 134 disposed in series between the fifth terminal 115 (i.e., the seventh terminal 117 and the power source GND. An input control portion is formed by (i) the inverter circuit 150 disposed at the signal line which connects the control input terminal 102 to the first MOS transistor 131 and (ii) the gates of the first and fourth MOS transistors 131, 134.

In the output circuit 170, the ninth and tenth MOS transistors 139, 140 are connected in series between the high-potential power source VDD and the low-potential power source GND. The ninth MOS transistor 139 is a P-MOS transistor and the gate thereof is connected to the sixth terminal 116. The tenth MOS transistor 140 is an N-MOS transistor and the gate thereof is connected to the seventh terminal 117. More specifically, the ninth and tenth MOS transistors 139, 140 are arranged such that the opening/closing states thereof are switched by control signals entered into the sixth and seventh terminals 116, 117 serving as the output control terminals. Provision is made such that the values of the control signals for determining the opening/closing states are inverted. The ninth and tenth MOS transistors 139, 140 serve as output generation switching elements.

The data output terminal 105 for supplying a data to the outside is connected to the signal line between the ninth MOS transistor 139 and the tenth MOS transistor 140. Between the sixth terminal 116 and the seventh terminal 117, there are disposed in parallel the sixth MOS transistor 136 which is a P-MOS transistor, and the seventh MOS transistor 137 which is an N-MOS transistor. The gate of the sixth MOS transistor 136 is connected to the control input terminal 102 through the inverter circuit 150, and the gate of the seventh MOS transistor 137 is connected directly to the control input terminal 102. Provision is made such that, according to the control signal En, the sixth and seventh terminals 116, 117 serving as a pair of output control terminals, i.e., the gates of the ninth and tenth MOS transistors 139, 140 at the output stage, are selectively electrically connected to each other and disconnected from each other by the sixth and seventh MOS transistors 136, 137. The foregoing arrangement forms an output control portion. Further, the sixth MOS transistor 136 and the seventh MOS transistor 137 serve as connection/disconnection changeover means.

Disposed between the sixth terminal 116 and the power source VDD is the fifth MOS transistor 135 which is an N-MOS transistor. Disposed between the seventh terminal 117 and the power source GND is the eighth MOS transistor 138 which is an N-MOS transistor. The gate of the fifth MOS transistor 135 is connected directly to the control input terminal 102, and the gate of the eighth MOS transistor 138 is connected to the control input terminal 102 through the inverter circuit 150. That is, the sixth terminal 116 which is one terminal of the pair of output control terminals, is connected, through the fifth MOS transistor 135, to the power source VDD for supplying a high-potential electric power, and the seventh terminal 117 which is the other terminal, is connected, through the eighth MOS transistor 138, to the grounding power source GND for supplying a low-potential electric power. Thus, the output control terminals are connected to the respective power sources through the switching elements of which opening/closing state is switched by the control signal En.

The following description will discuss the operation of this circuit with reference to a timing chart in FIG. 2. FIG. 2 is the timing chart illustrating the signal states of the respective portions in the output buffer circuit in FIG. 1. The following description will be made according to the state of the control signal En.

(1) When the control signal En is in the low level (hereinafter referred to as "L") (See the period P1 in FIG. 2):

In the input circuit 160, a signal in high level (hereinafter referred to as "H") obtained by inverting the control signal En, is entered into the gate of the first MOS transistor 131 through the inverter circuit 150. Accordingly, the first MOS transistor 131 which is a P-MOS transistor, is in the off state. Further, since a control signal in the state "L" is entered into the gate of the fourth MOS transistor 134, the fourth MOS transistor 134 which is an N-MOS transistor, is also turned off. The second and third MOS transistors 132, 133 are turned on or off according to the state of the data input signal Din.

Since the first and fourth MOS transistors 131, 134 in the input circuit 160 are turned off, the data input signal Din is not entered into the sixth and seventh terminals 116, 117 in the output circuit 170, regardless of the value of the data input signal Din or regardless of the fact that the second and third MOS transistors 132, 133 are turned on or off. Since a control signal in the state "L" is entered into the gate of the fifth MOS transistor 135, the fifth MOS transistor 135 which is a P-MOS transistor, is turned on, and the potential of the sixth terminal 116 is brought into the state "H". Further, since a control signal in the state "L" is entered into the gate of the eighth MOS transistor 138, the eighth MOS transistor 138 which is an N-MOS transistor, is turned off. However, an inversion signal in the state "H" of the control signal En is entered into the gate of the sixth MOS transistor 136 which is a P-MOS transistor, and a control signal in the state "L" is entered into the gate of the seventh MOS transistor 137 which is an N-MOS transistor. Accordingly, both the sixth and seventh MOS transistors 136, 137 are turned off. That is, since no electric power is supplied to the seventh terminal 117, the potential thereof is brought into the state "L". Accordingly, the ninth and tenth MOS transistors 139, 140 are turned off and an output from the data output terminal 105 is in the state of high impedance regardless of the value of the data input signal Din (See a part shown by a broken line in FIG. 2).

(2) When the control signal En is in the state "H" and the data input signal Din is in the state "H" (See the period P2a in FIG. 2):

Unlike in the case (1), both the first and fourth MOS transistors 131, 134 in the input circuit 160 are turned on, and the sixth and seventh terminals 116, 117 in the output circuit 170 are brought into states corresponding to the value of the data input signal Din through the second and third MOS transistors 132, 133. More specifically, since the data input signal Din is in the state "H", the second MOS transistor 132 is turned off and a data signal in the state "L" is entered into the sixth terminal 116 in the output circuit 170. Since the fifth MOS transistor 135 is turned off, the state "L" of the sixth terminal 116 is maintained. On the other hand, the third MOS transistor 133 in the input circuit 160 is turned on or electrically connected to the power source VDD. Accordingly, the potential of the seventh terminal 117 in the output circuit 170 is also brought in the state "L". At this time, both the sixth and seventh MOS transistors 136, 137 are turned on and electrically connected to each other. Since the ninth MOS transistor 139 is turned on and the tenth MOS transistor 140 is turned off, the data output signal Dout supplied from the data output terminal 105 is brought into the state "H".

(3) When the control signal En is in the state "H" and the data input signal Din is in the state "L" (See the period P2b in FIG. 2):

In the input circuit 160, both the first and fourth MOS transistors 131, 134 are turned on likewise in the case (2), but the second and third MOS transistors 132, 133 are turned on and off respectively unlike in the case (2). In the output circuit 170, the fifth MOS transistor 135 is turned off, the eighth MOS transistor 138 is turned off, and the sixth and seventh MOS transistors 136, 137 are turned off. Accordingly, the potentials of the sixth and seventh terminals 116, 117 are brought into the state "H", and the ninth MOS transistor 139 is turned off while the tenth MOS transistor 140 is turned on. That is, the output Dout from the data output terminal 105 is brought into the state "L".

Figure 9:
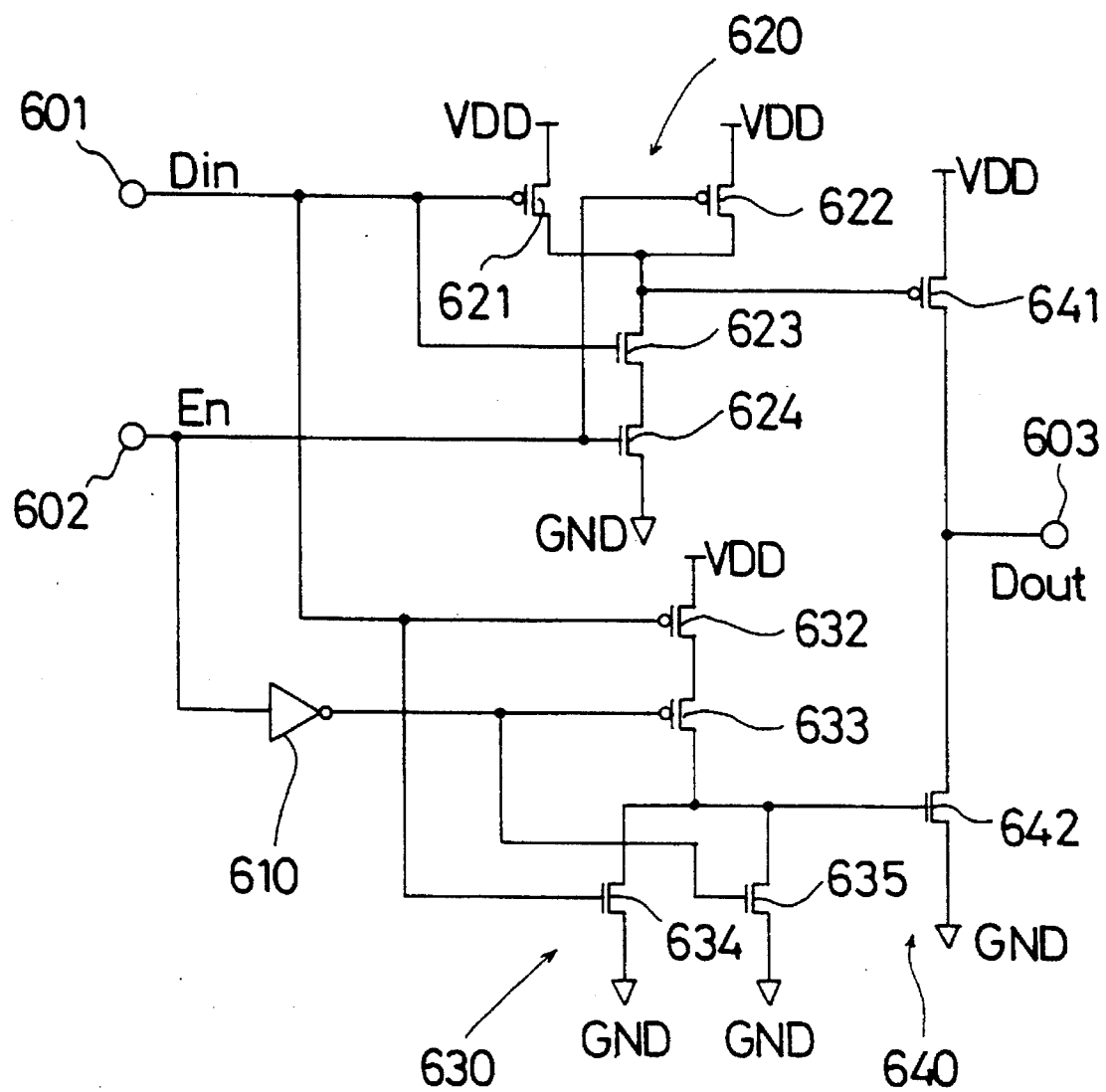
FIG. 9 is an electric circuit diagram illustrating the basic arrangement of a conventional ternary output-type buffer circuit for a single data input.

Thus, in the ternary output-type buffer circuit according to the first embodiment, the data output signal Dout is brought into the high-impedance state "Hz" regardless of the value of the data input signal Din when the control signal En is in the state "L", and the data output signal Dout is switched to either the state "H" or the state "L" according to the value of the data input signal Din when the control signal En is in the state "H". This is similar to the ternary output-type buffer circuit of prior art. In the ternary output-type buffer circuit of prior art, however, the data input signal Din is entered, through the P-MOS transistor 621, into one MOS transistor 641 out of a pair of MOS transistors 641, 642 which generate the data output signal Dout, and the data input signal Din is entered into the gate of the other MOS transistor 642 only when the control signal En is in the state "H" (See FIG. 9). On the other hand, the first embodiment of the present invention is arranged such that each of the output control terminals 116, 117 is switched, according to the state of the control signal En, to the state where the data input signal Din can be entered, or the state where the data input signal Din cannot be entered. It is therefore possible to securely control the state of potential between the ninth and tenth MOS transistors 139, 140 according to the state of the control signal. This achieves the basic arrangement of a ternary output-type buffer circuit different from the ternary output-type buffer circuit of prior art. Accordingly, even when a plurality of data input signals are to be entered as will be discussed, the ternary output buffer function can smoothly be performed without data signals interfering with one another, yet assuring low power consumption and a high-speed operation.

In particular, in the first embodiment, the input changeover portion is arranged such that the first and second MOS transistors 131, 132 are connected in series such that each of the output control terminals 116, 117 is switched to the state where the data input signal Din can be entered, or the state where the data input signal Din cannot be entered. Thus, there can securely be achieved the basic arrangement of the ternary output-type buffer circuit different from the ternary output-type buffer circuit of prior art.

According to the first embodiment, there are disposed, in the output circuit 170, the ninth and tenth MOS transistors (output generation MOS transistors) having the gates connected to the sixth and seventh terminals 116, 117 (output control terminals), respectively. The MOS transistors 139, 140 are connected in series to each other between the high-potential power source VDD and the low-potential power source GND, and the sixth and seventh terminals 116, 117 are connected to each other through the sixth and seventh MOS transistors 136, 137 serving as connection/disconnection changeover switching elements. More specifically, when the data output signal Dout is in the high-impedance state, the terminals 116, 117 are electrically disconnected from each other, thus readily providing the state where both the ninth and tenth MOS transistors 139, 140 are turned off. When the data output signal Dout is in other state, i.e., the state "H" or "L", the terminals 116, 117 are electrically connected to each other, thus readily providing the state where the MOS transistors 139, 140 are alternately turned off and on.

(Second Embodiment)

Figure 3:
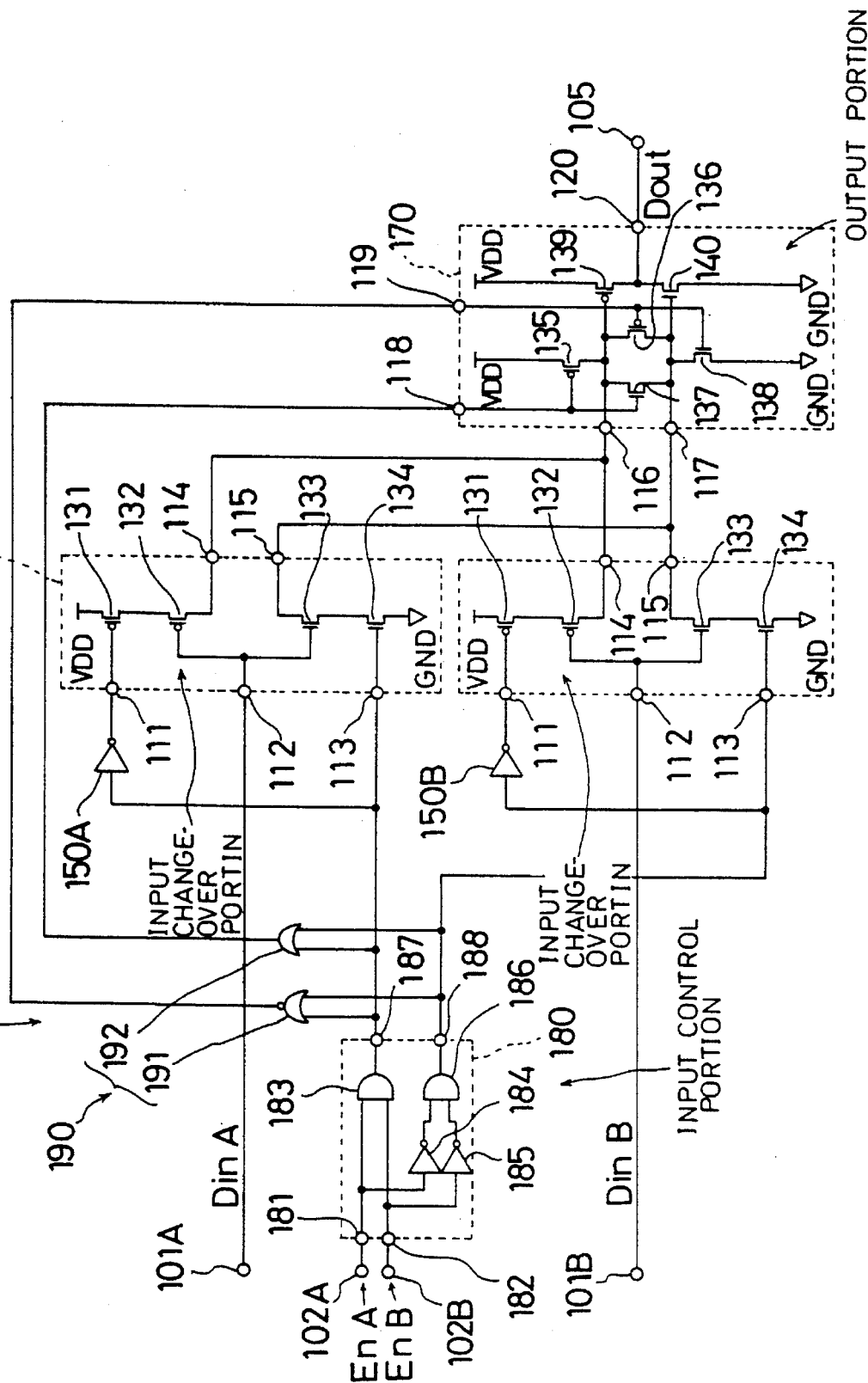
FIG. 3 is an electric circuit diagram illustrating the arrangement of an output buffer circuit according to a second embodiment of the present invention.
Figure 4:
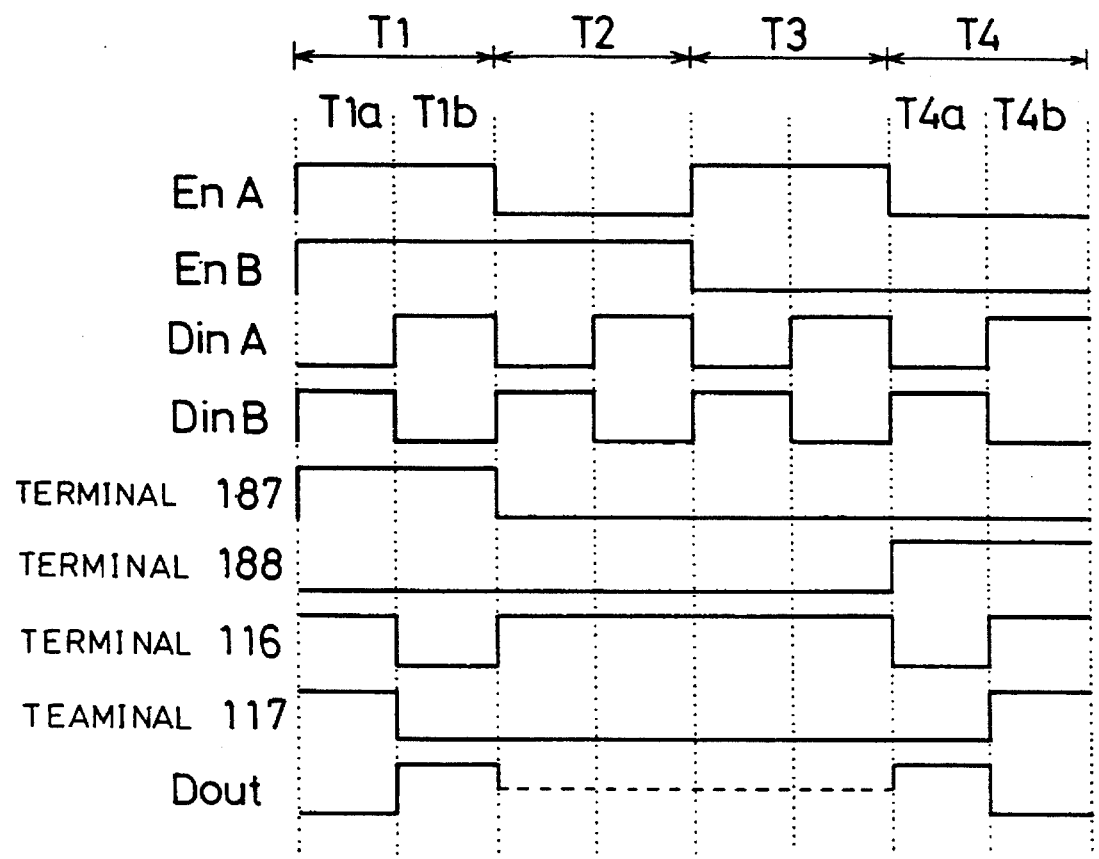
FIG. 4 is a timing chart illustrating the operational characteristics of the output buffer circuit according to each of the second embodiment and a third embodiment of the present invention.

The following description will discuss a second embodiment of the present invention with reference to FIGS. 3 and 4. FIG. 3 is a diagram of the output buffer circuit in the second embodiment, and FIG. 4 is a timing chart illustrating changes with the passage of time in signal state of the respective portions in the output buffer circuit of the second embodiment.

As shown in FIG. 3, the second embodiment comprises two data input terminals 101A, 101B and control input terminals 102A, 102B in the number identical with the number of the data input terminals. Disposed in the second embodiment are a single output circuit 170 and a single data output terminal 105 each of which has an arrangement of incorporated MOS transistors and terminals similar to that in the first embodiment. That is, the second embodiment is arranged such that a ternary signal is supplied from a data output terminal 105 according to the states of sixth and seventh terminals 116, 117 serving as a pair of output control terminals.

Unlike the first embodiment, the second embodiment comprises input circuits 160A, 160B in the number identical with that of the data input terminals 101A, 101B. However, the arrangement of terminals and MOS transistors disposed in each of the input circuits 160A, 160B, is the same as that of the input circuit 160 of the first embodiment. In the second embodiment, there are also disposed two inverter circuits 150A, 150B corresponding to the two input circuits 160A, 160B. Also disposed in the second embodiment are (i) a decoder circuit 180 for supplying signals which control the input circuits 160A, 160B according to the combination in state of control signals EnA, EnB supplied from the two control input terminals 102A, 102B, and (ii) an on/off changeover circuit 190 for controlling the on/off states of sixth and seventh MOS transistors 136, 137 in the output circuit 170.

Disposed in the decoder circuit 180 are (i) input terminals 181, 182 respectively connected to the first and second control input terminals 102A, 102B, (ii) an AND circuit 183 for generating an AND signal of first and second control signals EnA, EnB entered through the input terminals 181, 182, (iii) inverter circuits 184, 185 for generating inversion signals of the first and second control signals EnA, EnB, (iv) an AND circuit 186 for generating an AND signal of outputs of the inverter circuits 184, 185, and (v) output terminals 187, 188 for supplying the AND signals respectively generated by the AND circuits 183, 186, to the outside of the decoder circuit 180. The output terminals 187, 188 are connected to the inverter circuits 150A, 150B and to third terminals 113 of the input circuits 160A, 160B. Provision is made such that the opening/closing state of first MOS transistors 131 of the input circuits 160A, 160B is switched according to the combination in state of the control signals EnA. EnB. An input control portion is formed by the decoder circuit 180, the inverter circuits 150A, 150B and the gates of the transistors 131, 134.

Disposed in the on/off changeover circuit 190 is a NOR circuit 191 for generating a NOR signal of outputs from the output terminals of the decoder circuit 180. The output terminal of the NOR circuit 191 is connected to the gate of the sixth MOS transistor 136 of the output circuit 170. Also disposed is an OR circuit 192 for generating an OR signal of outputs from the output terminals of the decoder circuit 180. The output terminal of the OR circuit 192 is connected to the gate of the seventh MOS transistor 137 in the output circuit 170. More specifically, provision is made such that the sixth and seventh MOS transistors 136, 137 serving as the connection/disconnection changeover switching elements are turned off by the on/off changeover circuit 190 only when the data output signal Dout is in the high-impedance state, as will be discussed later.

An output control portion is formed by the on/off changeover circuit 190, fifth to eighth MOS transistors 135 to 138, and power sources VDD, GND.

The following description will discuss the operation of the output buffer circuit in FIG. 3 with reference to the timing chart in FIG. 4.

(1) When both the control signals EnA, EnB are in the state "H" (Period T1 in FIG. 4):

In the decoder circuit 180, one output terminal 187 is brought into the state "H", and the other output terminal 188 is brought into the state "L". At this time, since the first MOS transistor 131 in the input circuit 160B is turned off, the fourth and fifth terminals 114, 115 of the input circuit 160B are brought into the state "Hz". On the other hand, since the first MOS transistor 131 in the input circuit 160A is turned on, the output control terminals 116, 117 can be ready for receiving the data input signal DinA through the fourth and fifth terminals 114, 115 in the input circuit 160A. In the on/off changeover circuit 190, an output of the NOR circuit 191 is brought into the state "L" and an output of the OR circuit 192 is brought into the state "H". In the output circuit 170, the fifth MOS transistor 135 and the eighth MOS transistor 138 are turned off, the sixth MOS transistor 136 and the seventh MOS transistor 137 are turned on, and the sixth and seventh terminals 116, 117 serving as the output control terminals in the output circuit 170 are electrically connected to each other.

(a) When the data input signal DinA is in the state "H":

The fourth and fifth terminals 114, 115 in the input circuit 160A are brought into the state "L" and a signal in the state "L" is entered into the gates of the ninth and tenth MOS transistors 139, 140 in the output circuit 170. Accordingly, the data output signal Dout is brought into the state "H" which is equal to the level of the data input signal DinA (See the period T1b in FIG. 4).

(b) When the data input signal DinA is in the state "L":

The fourth and fifth terminals 114, 115 in the input circuit 160A are brought into the state "H" and a signal in the state "H" is entered into the gates of the ninth and tenth MOS transistors 139, 140 in the output circuit 170. Accordingly, the data output signal Dout is brought into the state "L" which is equal to the level of the data input signal DinA (See the period T1a in FIG. 4).

(2) When the control signals EnA, EnB are in the states "L" and "H" respectively (Period T2 in FIG. 4):

In the decoder circuit 180, both the output terminals 187, 188 are brought into the state "L". At this time, since a signal in the state "H" is entered into the first terminals 111 in the input circuits 160A, 160B, the first MOS transistors 131 are turned off. This provides the state where any of the data input signals DinA, DinB is not entered into the sixth and seventh terminals 116, 117 in the output circuit 170 regardless of the values of the data input signals DinA, DinB. In the on/off changeover circuit 190, an output of the NOR circuit 191 is brought into the state "H". In the output circuit 170, the eighth MOS transistor 138 is turned on and the sixth MOS transistor 136 is turned off. An output of the OR circuit 192 is brought into the state "L". In the output circuit 170, the fifth MOS transistor 135 is turned on and the seventh MOS transistor 137 is turned off. Accordingly, the potential of the sixth terminal 116 is brought into the state "H" and a signal in the state "H" is entered into the gate of the ninth MOS transistor 139, causing the ninth MOS transistor 139 to be turned off. On the other hand, the potential of the seventh terminal 117 is brought into the state "L" and a signal in the state "L" is entered into the gate of the tenth MOS transistor 140 in the output circuit 170, causing the tenth MOS transistor 140 to be turned off. That is, the data output signal Dout from the data output terminal 105 is brought into the state "Hz" (See the part shown by a broken line in FIG. 4).

(3) When the control signals EnA, EnB are in the states "H" and "L" respectively (Period T3 in FIG. 4):

Both the output terminals 187, 188 in the decoder circuit 180 are brought into the state "L". Accordingly, the data output signal Dout is brought into the state "Hz" likewise in the case (2) (See the part shown by a broken in FIG. 4).

(4) When the control signals EnA, EnB are in the state "L" (Period T4 in FIG. 4):

In the decoder circuit 180, one output terminal 187 is brought into the state "L" and the other output terminal 188 is brought into the state "H". At this time, since the first MOS transistor 131 in the input circuit 160A is turned off, the fourth and fifth terminals 114, 115 are brought into the state "Hz" regardless of the data input signal DinA. On the other hand, the first MOS transistor 131 in the input circuit 160B is turned on, thus providing the state where the data input signal DinB can be entered into the sixth and seventh terminals 116, 117 in the output circuit 170 through the fourth and fifth terminals 114, 115 in the input circuit 160B. In the on/off changeover circuit 190, an output of the NOR circuit 191 is brought into the state "L" and an output of the OR circuit 192 is brought into the state "H". Accordingly, the sixth and seventh terminals 116, 117 in the output circuit 170 are electrically connected to each other by the operation similar to that in the case (1).

(a) When the data input signal DinB is in the state "H":

The fourth and fifth terminals 114, 115 in the input circuit 160B are brought into the state "L", and a signal in the state "L" is entered into the gates of the ninth and tenth MOS transistors 139, 140 in the output circuit 170. Accordingly, the data output signal Dout is brought into the state "H" which is equal to the level of the data input signal DinB (See the period T4a in FIG. 4).

(b) When the data input signal DinB is in the state "L":

The fourth and fifth terminals 114, 115 in the input circuit 160B are brought into the state "H", and a signal in the state "H" is entered into the gates of the ninth and tenth MOS transistors 139, 140 in the output circuit 170. Accordingly, the data output signal Dout is brought into the state "L" which is equal to the level of the data input signal DinB (See the period T4b in FIG. 4).

Figure 10:
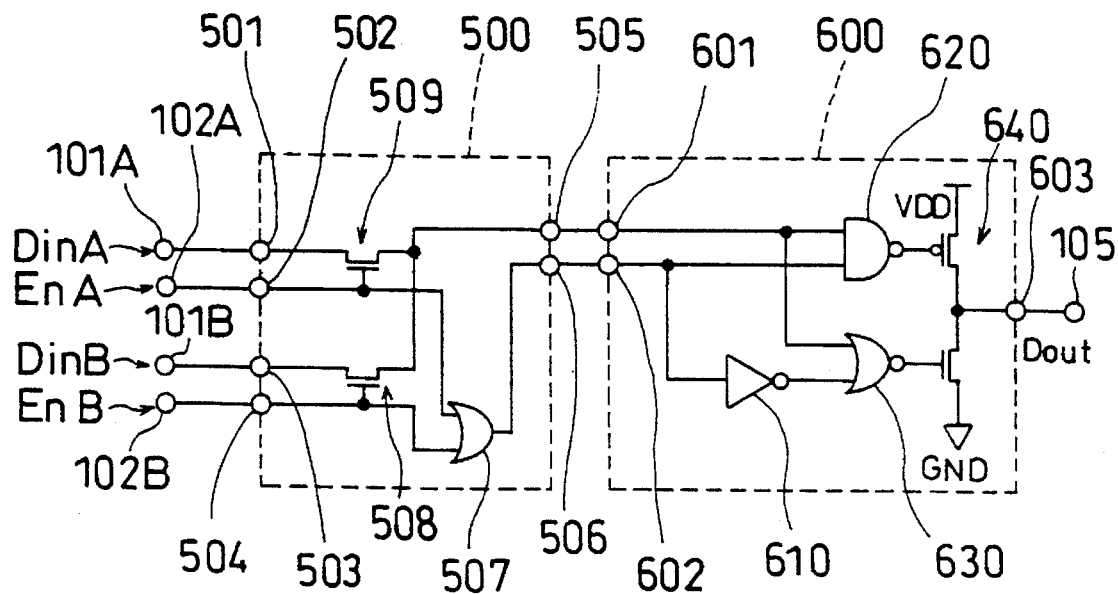
FIG. 10 is an electric circuit diagram of a conventional ternary output-type buffer circuit having a selector for a plurality of data inputs.
Figure 11:
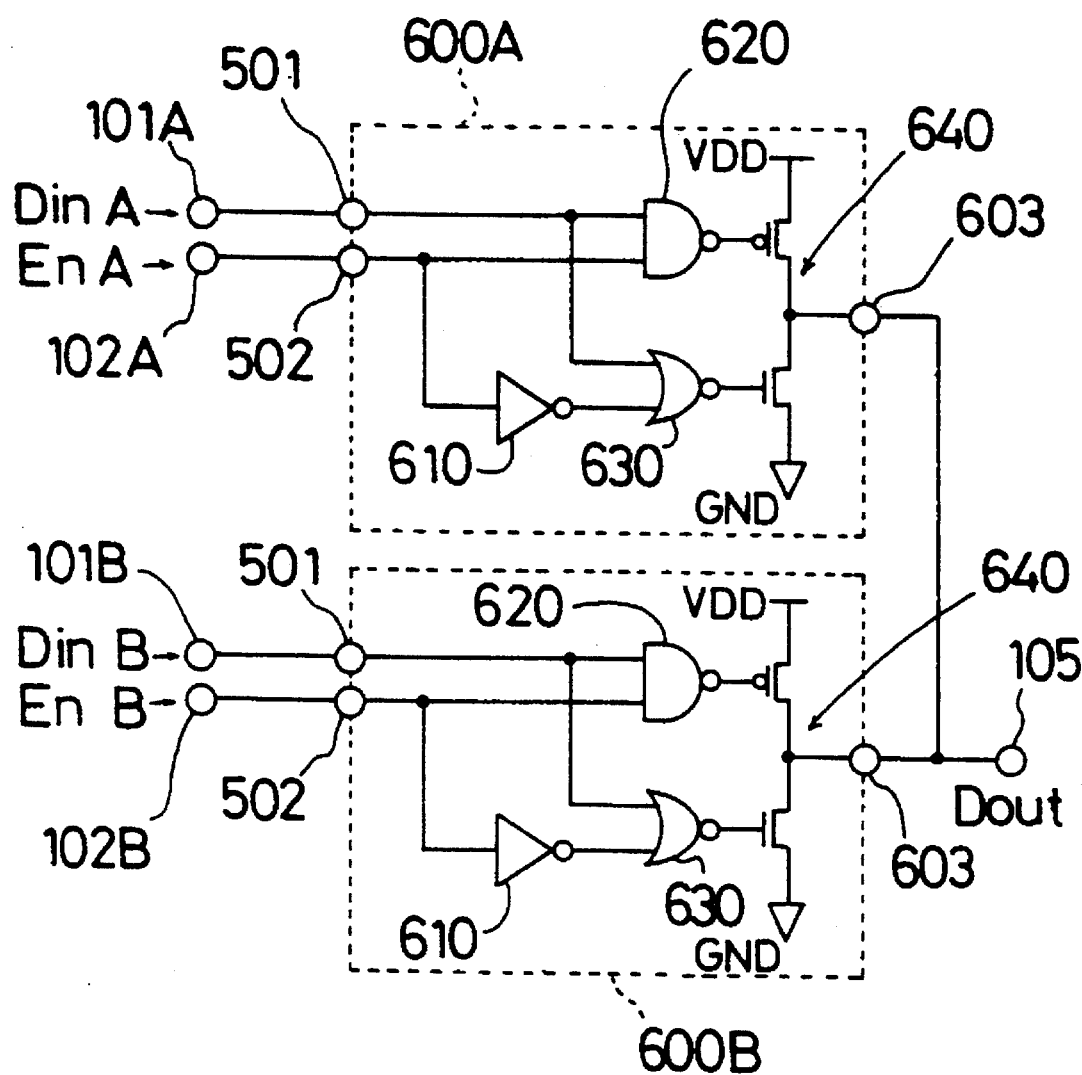
FIG. 11 is an electric circuit diagram illustrating a conventional arrangement in which a plurality of ternary output-type buffer circuits are disposed in parallel for a plurality of data inputs.

Thus, according to the second embodiment, there can selectively be supplied, as the data output signal Dout, any of "DinA", "DinB", "Hz" according to the control signals EnA, EnB with no increase in the number of logic stages or in the drain capacitance at the output stage as is the case with each of the arrangements of prior art shown in FIGS. 10 and 11.

More specifically, the second embodiment does not take much time for signal processing to lower the processing speed as done in the arrangement of prior art in FIG. 10 in which a selector for selecting any from a plurality of data inputs and control inputs is disposed at the input side of the output buffer circuit. Also, the second embodiment does not require an increase in the drain capacitance at the final output stage as done in the arrangement of prior art shown in FIG. 11 in which a plurality of output buffer circuits are disposed in parallel corresponding to data inputs and control inputs. That is, the ninth and tenth MOS transistors 139, 140 at the final output stage are disposed for generating output signals and therefore require very large capacitance as compared with other MOS transistors 131 to 138. Accordingly, the required number of pairs of MOS transistors at the final output stage is made one. Thus, there can be supplied a ternary signal without the drain capacitance increased even though the number of data inputs is increased.

(Third Example)

Figure 5:
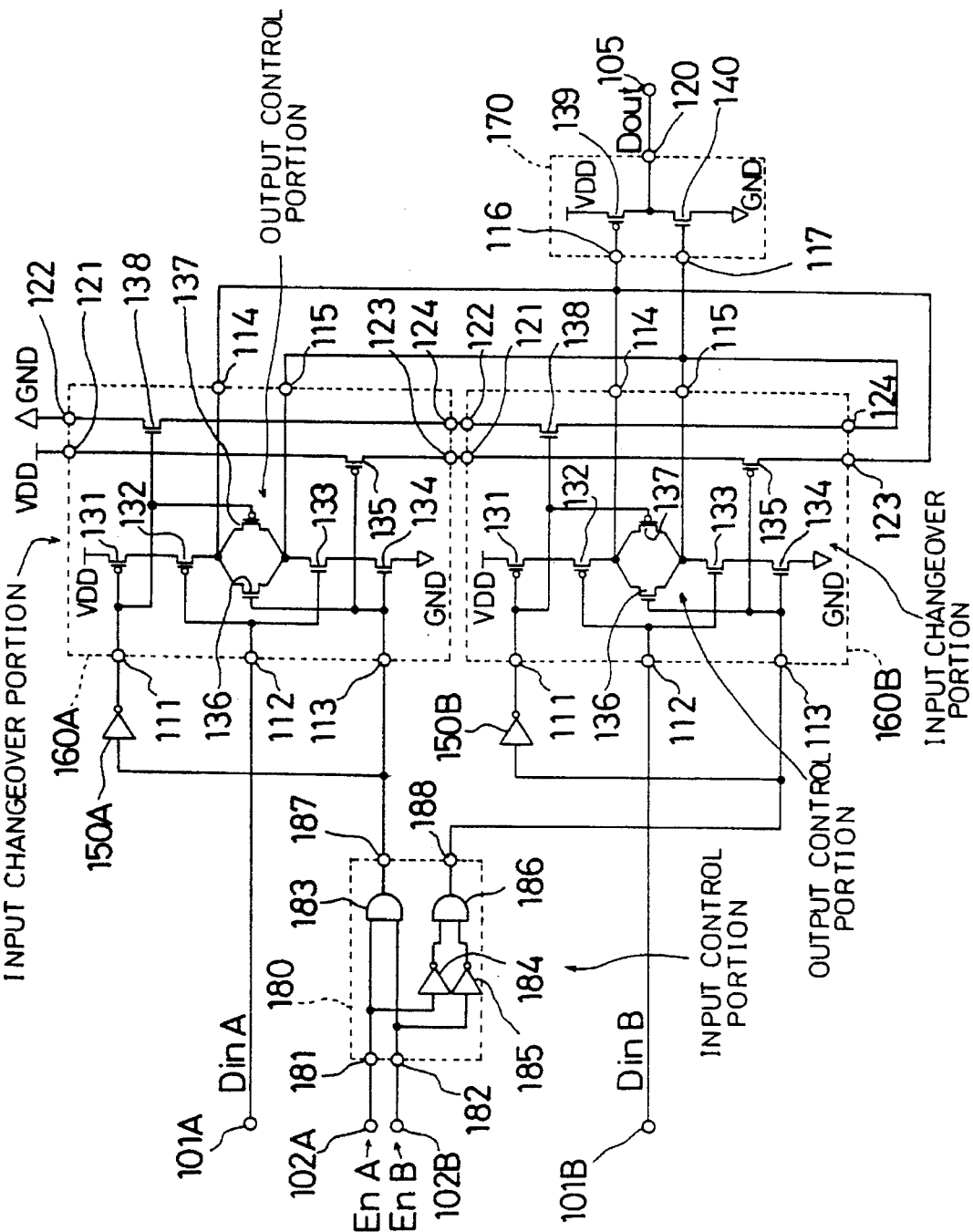
FIG. 5 is an electric circuit diagram illustrating the arrangement of an output buffer circuit according to the third embodiment.
Figure 6:
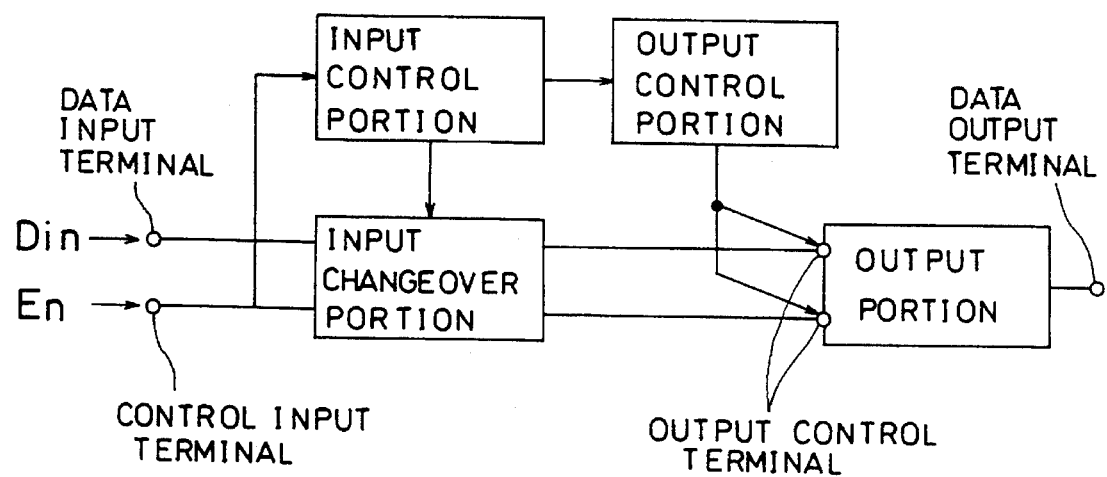
FIG. 6 is a block diagram of the basic arrangement of an output buffer circuit having a single data input.
Figure 7:
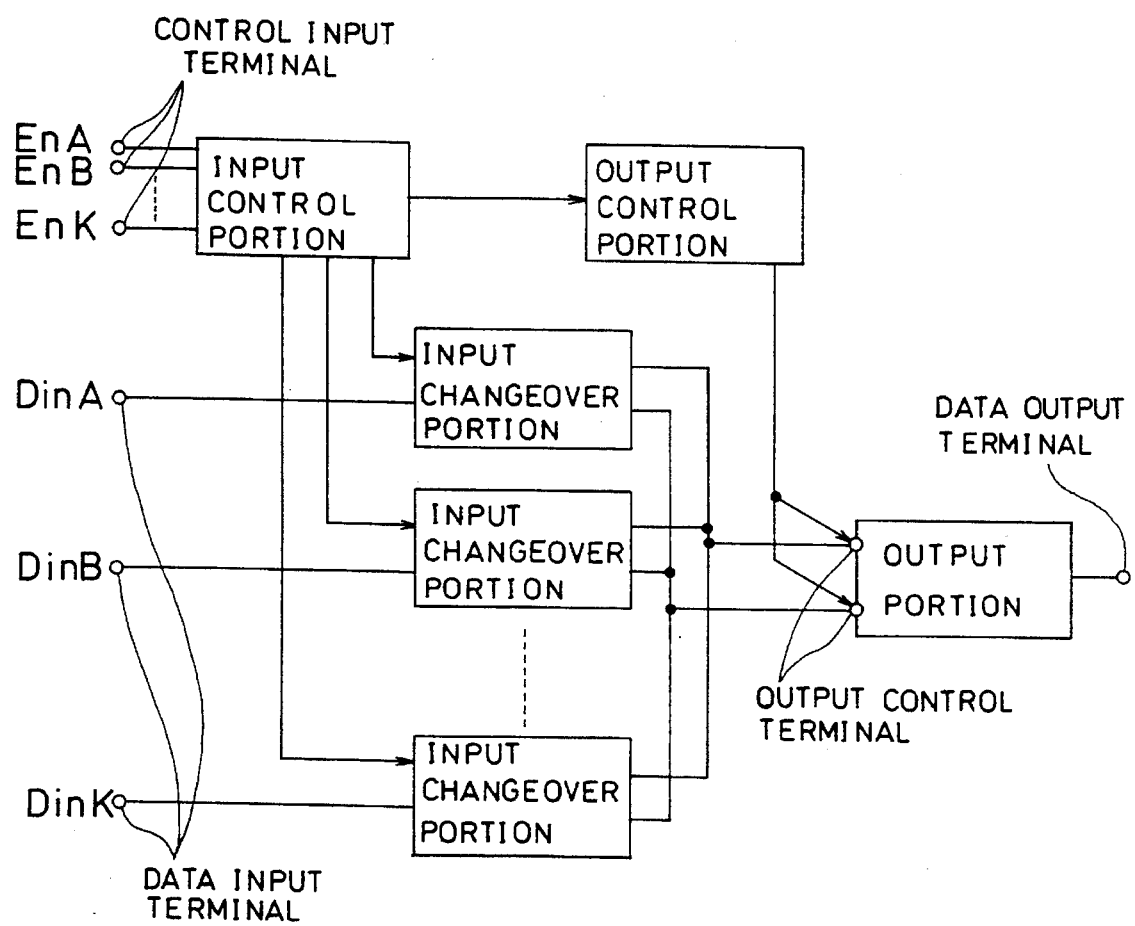
FIG. 7 is a block diagram of the basic arrangement of an output buffer circuit having a plurality of data inputs.
Figure 8:
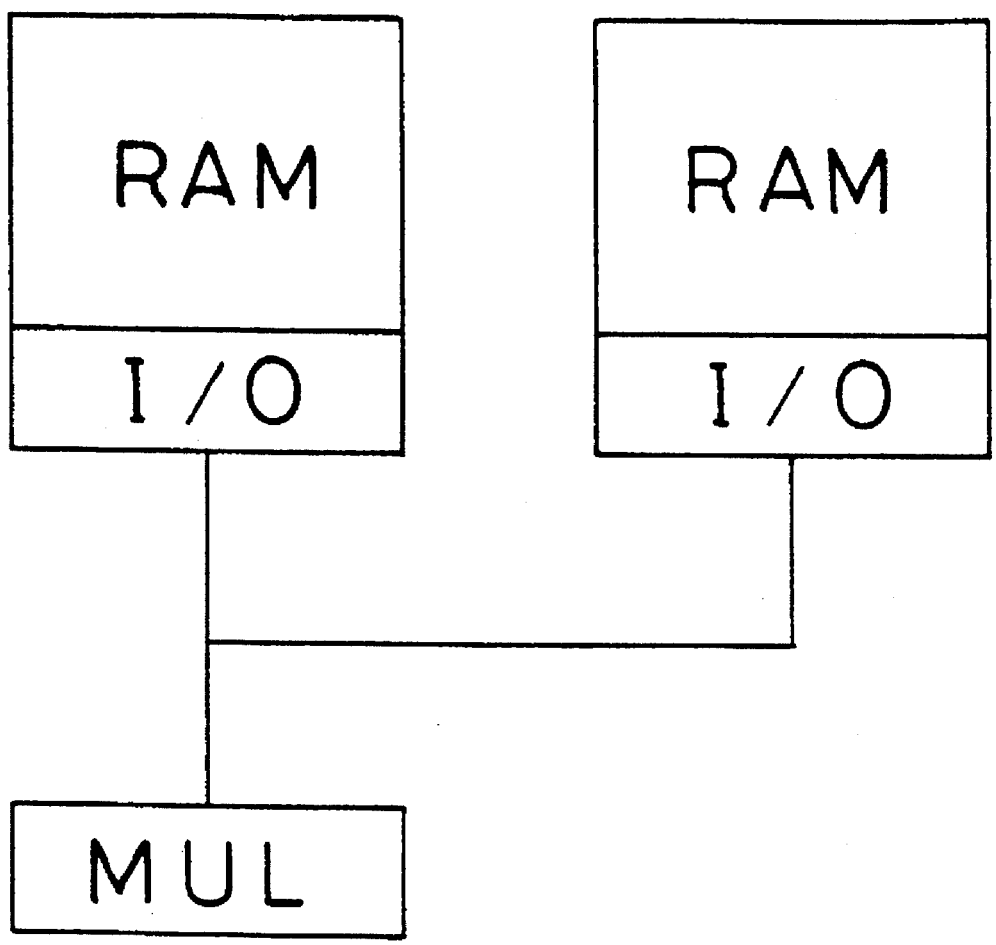
FIG. 8 is a block diagram of a general arrangement of a RAM in which the output buffer circuit is disposed.

The following description will discuss a third embodiment of the present invention with reference to FIG. 5 and FIG. 4 referred to in the description of the second embodiment. FIG. 5 is an electric circuit diagram of an output buffer circuit in the third embodiment.

In FIG. 5, the third embodiment is similar to the second embodiment in that there are disposed two data input terminals 101A, 101B, two control input terminals 102A, 102B, two inverter circuits 150A, 150B, two input circuits 160A, 160B, one decoder circuit 180 and one output circuit 170. Also, the third embodiment is the same as the second embodiment in that each of the input circuits 160A, 160B is arranged such that first and second MOS transistors 131, 132 are connected in series between a power source VDD for supplying a high-potential electric power and a fourth terminal 114 or a sixth terminal 116 in the output circuit 170, and that third and fourth MOS transistors 133, 134 are connected in series between a grounding power source GND and a fifth terminal 115 or a seventh terminal 117 in the output circuit 170. However, the third embodiment is different from the second embodiment in the arrangements of the input circuits 160A, 160B and the output circuit 170. In the third embodiment, the output circuit 170 comprises ninth and tenth MOS transistors 139, 140, the sixth and seventh terminals 116, 117 and a tenth terminal 120. In each of the input circuits 160A, 160B, there are disposed, through the fourth and fifth terminals 114, 115, sixth and seventh MOS transistors 136, 137 for switching the electrical connection between the sixth and seventh terminals 116, 117 in the output circuit 170. However, the third embodiment is similar to the second embodiment in the passages of signals supplied to the gates of the sixth and seventh MOS transistors 136, 137.

In the third embodiment, each of the input circuits 160A, 160B incorporates a portion having the function of the on/off changeover circuit 190 comprising the NOR and OR circuits included in the output control portion in the second embodiment. More specifically, the third embodiment is arranged such that the fifth and eighth MOS transistors 135, 138 having functions similar to those of the fifth and eighth MOS transistors 135, 138 in the second embodiment, are disposed in each of the input circuits 160A, 160B. However, the fifth MOS transistors 135 in the input circuits 160A, 160B are connected in series between the high-potential power source VDD and the sixth terminals 116, and the eighth MOS transistors 138 in the input circuits 160A, 160B are connected in series between the seventh terminals 117 and the low-potential power source GND.

The following description will discuss the basic operation of each of the input circuits 160A, 160B.

(1) When a signal "H" is entered into the first terminal 111 and a signal "L" is entered into the third terminal 113:

A signal in the state "H" is entered into the gates of the first, sixth, eighth MOS transistors 131, 136, 138, and a signal in the state "L" is entered into the gates of the fourth, fifth, seventh MOS transistors 134, 135, 137. Accordingly, regardless of an input into the second terminal 112, the first, fourth, sixth, seventh MOS transistors 131, 134, 136, 137 are turned off, the fifth and eighth MOS transistors 135, 138 are turned on, the state "Hz" is provided between the fourth and fifth terminals 114, 115, eleventh and thirteenth terminals 121, 123 are electrically connected to each other, and twelveth and fourteenth terminals 122, 124 are electrically connected to each other.

(2) When a signal in the state "L" is entered into the first terminal 111 and a signal in the state "H" is entered into the third terminal 113:

A signal in the state "L" is entered into the gates of the first, sixth, eighth MOS transistors 131, 136, 138, and a signal in the state "H" is entered into the gates of the fourth, fifth, seventh MOS transistors 134, 135, 137. Accordingly, the first, fourth, sixth, seventh MOS transistors 131, 134, 136, 137 are turned on, the fifth and eighth MOS transistors 135, 138 are turned off, the fourth and fifth terminals 114, 115 are electrically connected to each other, the eleventh and thirteenth terminals 121, 123 are electrically disconnected from each other, and the twelveth and fourteenth terminals 122, 124 are electrically disconnected from each other.

At this time, when a signal in the state "H" is entered, as the data input signal Din, into the second terminal 112, the second MOS transistor 132 is turned off, the third MOS transistor 133 is turned on, and the fourth and fifth terminals 114, 115 are brought into the state "L" (i.e., an inversion signal of the signal at the second terminal 112). On the other hand, when a signal in the state "L" is entered into the second terminal 112, the second MOS transistor 132 is turned on, the third MOS transistor 133 is turned off and the fourth and fifth terminals 114, 115 are brought into the state "H" (i.e., an inversion signal of the signal at the second terminal 112).

The following description will discuss the operation of the output circuit 170 with reference to the timing chart in FIG. 4 which also shows the operational characteristic of the output circuit 170.

(1) When both control signals EnA, EnB are in the state "H" (Period T1 in FIG. 4):

The output terminals 187, 188 in the decoder circuit 180 are brought into the states "H" and "L" respectively, a signal in the state "H" is entered into the third terminal 113 of the input circuit 160A, a signal in the state "L" is entered into the first terminal 111 of the input circuit 160A, a signal in the state "L" is entered into the third terminal 113 of the input circuit 160B and a signal in the state "H" is entered into the first terminal 111 of the input circuit 160B. Accordingly, in the input circuit 160A, the eleventh and thirteenth terminals 121, 123 are electrically disconnected from each other, the tenth and twelveth terminals 120, 122 are electrically disconnected from each other, and the fourth and fifth terminals 114, 115 are electrically connected to each other. Accordingly, the fourth and fifth terminals 114, 115 are alternately brought into the state "L" and "H" according to the state "H" or "L" of the data input signal DinA. In the input circuit 160B, regardless of the data input signal DinB, the eleventh and thirteenth terminals 121, 123 are electrically connected to each other, the tenth and twelveth terminals 120, 122 are electrically connected to each other, and the fourth and fifth terminals 114, 115 are electrically disconnected from each other and the state "Hz" is provided therebetween. Thus, according to the state "H" or "L" of the data input signal DinA, the sixth and seventh terminals 116, 117 in the output circuit 170 simultaneously receive a signal in the state "L" or "H", and the data output signal Dout is brought into the state "H" or "L" equal to the level of the data input signal DinA (See Periods T1a, T1b in FIG. 4).

(2) When the control signals EnA, EnB are in the states "H" and "L", respectively (Period T2 in FIG. 4):

The output terminals 187, 188 in the decoder circuit 180 are brought into the state "L". At this time, in each of the input circuits 160A, 160B, a signal in the state "H" is entered into the first terminal 111, and a signal in the state "L" is entered into the third terminal 113. In each of the input circuits 160A, 160B, regardless of the data input signals DinA, DinB, the eleventh and thirteenth terminals 121, 123 are electrically connected to each other, the tenth and twelveth terminals 120, 122 are electrically connected to each other, the fourth and fifth terminals 114, 115 are electrically disconnected from each other and the state "Hz" is provided therebetween. Accordingly, signals in the states "H" and "L" are respectively entered into the sixth and seventh terminals 116, 117 in the output circuit 170. Both the ninth and tenth MOS transistors 139, 140 are turned off and the data output signal Dout is brought into the state "Hz" (See a part shown by a broken line in FIG. 4).

(3) When the control signals EnA, EnB are in the states "L" and "H", respectively (Period T3 in FIG. 4):

The output terminals 187, 188 in the decoder circuit 180 are brought into the state "L". Accordingly, regardless of the data input signals DinA. DinB, the data output signal Dout is brought into the state "Hz" likewise in the case (2) (See the part shown by a broken line in FIG. 4).

(4) When both the control signals EnA, EnB are in the state "L" (Period T4 in FIG. 4):

The output terminals 187, 188 in the decoder circuit 180 are brought into the states "L" and "H", respectively. In the input circuit 160B, a signal in the state "H" is entered into the third terminal 113 and a signal in the state "L" is entered into the first terminal 111. In the input circuit 160A, a signal in the state "L" is entered into the third terminal 113 and a signal in the state "H" is entered into the first terminal 111. Accordingly, in the input circuit 160B, the eleventh and thirteenth terminals 121, 123 are electrically disconnected from each other, the tenth and twelveth terminals 120, 122 are electrically disconnected from each other, and the fourth and fifth terminals 114, 115 are electrically connected to each other. Thus, according to the state "H" or "L" of the data input signal DinB, the fourth and fifth terminals 114, 115 are alternately brought into the states "L" and "H". In the input circuit 160A, regardless of the data input signal DinA, the eleventh and thirteenth terminals 121, 123 are electrically connected to each other, the tenth and twelveth terminals 120, 122 are electrically connected to each other, and the fourth and fifth terminals 114, 115 are electrically disconnected from each other and the state "Hz" is provided therebetween. Thus, according to the state "H" or "L" of the data input signal DinB, the sixth and seventh terminals 116, 117 in the output circuit 170 simultaneously receive a signal in the state "L" or "H", and the data output signal Dout is brought into the state "H" or "L" which is equal to the level of the data input signal DinB (See Periods T4a, T4b in FIG. 4).

Likewise in the second embodiment, the output buffer circuit according to the third embodiment is arranged such that any of "DinA", "DinB", "Hz" can selectively be supplied as the data output signal according to the control signals EnA, EnB with no increase in the number of logic stages and the drain capacitance of the output stage.

As compared with the second embodiment, the third embodiment is arranged such that the sixth and seventh MOS transistors 136, 137 for switching the electrical connection/disconnection between the output control terminals 116, 117 are disposed in each of the input circuits 160A, 160B. This increases the number of component elements, but reduces the number of wirings. It is therefore possible to selectively utilize the arrangements of the second and third embodiments dependent on the circuit design as to the number of data input signals and the like.

In each of the second and third embodiments, the description has been made of an example of an output buffer circuit for receiving two data input signals DinA, DinB. However, the present invention should not be limited to these embodiments, but can cope with an arrangement for receiving three or more data input signals, by disposing the input circuit 160 in the number identical with the number of data input signals.

We claim:

1. An output buffer circuit comprising:

a data input terminal for receiving a data signal having a first value and a second value;

a control input terminal for receiving a control signal;

an output portion having a pair of output control terminals, said output portion being arranged for generating a data output signal comprising three values of first, second and high impedance values, said data output signal's value being determined in accordance with the signal states of said output control terminals which are in turn determined by the values of the data signal and the control signal;

a data output terminal for externally supplying said data output signal generated by said output portion;

an input changeover portion disposed at the signal lines between said data input terminal and said output control terminals and having (I) a conductive state where an inverse of said data signal can be entered into said output control terminals and (ii) a non-conductive state where said inverse of said data signal cannot be entered into said output control terminals;

wherein said input changeover portion receives said control signal supplied from said control input terminal which switches said input changeover portion to either said conductive state or said non-conductive state; and an output control portion for receiving said control signal, wherein said data output signal is identical to said data signal applied to said data input terminal when said input changeover portion is in said conductive state and said data output signal is brought into said high impedance value when said input changeover portion is in said non-conductive state.

2. An output buffer circuit according to claim 1, wherein said input changeover portion comprises two pairs of switching elements;

one pair being connected in series between a power source for supplying high potential corresponding to said first value of said data signal and one of said output control terminals, and the other pair being connected in series between a power source for supplying low potential corresponding to said second value of said data signal and the other of said output control terminals, said switching elements being arranged to be opened and closed according to said data signal and said control signal.

3. An output buffer circuit according to any of claims 1 or 2, wherein said output portion comprises:

a first output generation switching element disposed between said power source for supplying a high-potential electric power corresponding to said first value of said data signal and said data output terminal, said switching element being so arranged as to be opened/closed according to the signal state of one of said pair of output control terminals; and a second output generation switching element disposed between a power source for supplying a low-potential electric power corresponding to said second value of said data signal and said data output terminal, said switching element being so arranged as to be opened/closed according to the signal state of the other of said output control terminals, said output control portion comprises;

connection/disconnection changeover means for electrically connecting and disconnecting said pair of output control terminals to and from each other when said input changeover portion is in said conductive state and non-conductive state, respectively; and high impedance signal introducing means for turning off said first and second output switching elements when said input changeover portion is in said non-conductive state which introduces a high impedance signal to said data output terminal.

4. An output buffer circuit comprising:

a plurality of data input terminals for receiving data signals;

a plurality of control input terminals for receiving control signals;

an output portion having a pair of output control terminals, said output portion being arranged for generating a data output signal comprising three values of first, second and high impedance values, said data output signal's value being determined in accordance with the signal states of said output control terminals which are in turn determined by the value of the data signals and the control signals;

a data output terminal for externally supplying said data output signal generated by said output portion;

a plurality of input changeover portions each disposed at the signal lines between each of said data input terminals and said pair of output control terminals and having (I) a conductive state where an inverse of each of said data signals can be entered into said output control terminals and (ii) a non-conductive state where said inverse of each of said data signals cannot be entered into said output control terminals, the number of said input changeover portions being the same as that of said data input terminals;

an input control portion connected to said control input terminals for generating, according to the states of said control signals, a changeover signal for switching said input changeover portions to any of (I) a mode in which only one of said input changeover portions is set to said conductive state and (ii) a mode in which all of said input changeover portions are set to said non-conductive state; and at least one output control portion for receiving said changeover signal generated by said input control portion to control said output portion such that, according to a changeover signal for setting only one of said input changeover portions to said conductive state, an output supplied from said data output terminal is made identical with the value of the data signal entered into said output control terminals and that, according to a changeover signal for setting all of said input changeover portions to said non-conductive state, an output supplied from said data output terminal is brought into a high impedance value.

5. An output buffer circuit according to claim 4, wherein each of said input changeover portions comprises two pairs of switching elements;

one pair being connected in series between one of said output control terminals and a high-potential side power source, and the other pair being connected in series between the other of said output control terminals and a low-potential side power source, said switching elements being arranged to be opened and closed according to said data signals and said control signals.

6. An output buffer circuit according to any of claims 4 or 5, wherein said output portion comprises:

a first output generation switching element disposed between said power source for supplying a high-potential electric power corresponding to a first value of each of said data signals and said data output terminal, said switching element being so arranged as to be opened/closed according to the signal state of one of said pair of output control terminals; and a second output generation switching element disposed between said power source for supplying a low-potential electric power corresponding to a second value of each of said data signals and said data output terminal, said switching element being so arranged as to be opened/closed according to the signal state of the other of said output control terminals, said output control portion comprises;

connection/disconnection changeover means for electrically connecting and disconnecting said pair of output control terminals to and from each other when one of said input changeover portions is in said conductive state and non-conductive state, respectively; and high impedance signal introducing means for turning off said first and second output switching elements when all of said input changeover portions are in said non-conductive state which introduces a high impedance signal to said data output terminal.

7. An output buffer circuit according to claim 6, wherein said connection/disconnection changeover means and said high impedance signal introducing means are disposed in each of said input changeover portions.

8. An output buffer circuit according to claim 6, wherein said connection/disconnection changeover means and said high impedance signal introducing means are shared among said input changeover portions.

9. An output buffer circuit according to any of claims 4 or 5 wherein said output buffer circuit is disposed at the output side of a SRAM memory cell.

* * * * *